(12) United States Patent
Sloan

(10) Patent No.: US 6,353,524 B1
(45) Date of Patent: Mar. 5, 2002

(54) INPUT/OUTPUT CIRCUIT HAVING UP-SHIFTING CIRCUITRY FOR ACCOMMODATING DIFFERENT VOLTAGE SIGNALS

(75) Inventor: Jeffrey Hubert Sloan, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,865

(22) Filed: Mar. 17, 2000

(51) Int. Cl.[7] ............................................... H02H 3/22
(52) U.S. Cl. ...................................................... 361/111
(58) Field of Search .................... 361/96, 111; 257/361, 257/296, 360; 438/135, 203, 237

(56) References Cited

U.S. PATENT DOCUMENTS

| 5,300,835 A | 4/1994 | Assar et al. ................... 326/68 |
| 5,455,732 A | 10/1995 | Davis ........................... 361/90 |
| 5,479,116 A | 12/1995 | Sallaerts et al. ............... 326/80 |
| 5,528,172 A | 6/1996 | Sundstrom ..................... 326/80 |
| 5,530,379 A | 6/1996 | Konishi et al. ................ 326/68 |
| 5,534,795 A | 7/1996 | Wert et al. ..................... 326/81 |
| 5,568,065 A | 10/1996 | Wert et al. ..................... 326/33 |
| 5,583,454 A | 12/1996 | Hawkins et al. ............... 326/81 |
| 5,617,045 A | 4/1997 | Asahina ........................ 327/89 |
| 5,635,861 A | 6/1997 | Chan et al. .................... 326/81 |
| 5,739,700 A | 4/1998 | Martin ......................... 326/80 |
| 5,742,465 A | 4/1998 | Yu ............................. 361/111 |
| 5,793,592 A | 8/1998 | Adams et al. ................. 361/90 |
| 5,801,569 A | 9/1998 | Pinkham ...................... 327/333 |
| 5,815,354 A | 9/1998 | Braceras et al. .............. 361/56 |
| 5,821,804 A | 10/1998 | Nikutta et al. ............... 327/382 |
| 5,825,205 A | 10/1998 | Ohtsuka ....................... 326/81 |
| 5,952,875 A | * 9/1999 | Yosefin et al. ............... 327/545 |
| 6,218,706 B1 | * 4/2001 | Waggoner et al. .......... 257/355 |
| 6,255,850 B1 | * 7/2001 | Turner ......................... 326/81 |
| 6,294,943 B1 | * 9/2001 | Wall et al. ................... 327/328 |

* cited by examiner

*Primary Examiner*—Peter S. Wong
*Assistant Examiner*—Pia Tibbits
(74) *Attorney, Agent, or Firm*—McGinn & Gibb, PLLC; Eugene I. Shkurko, Esq.

(57) ABSTRACT

The invention comprises an input/output circuit of an integrated circuit chip that includes a pad, a protection circuit connected to the pad, and an up-shift circuit connected to the pad and the protection circuit. The up-shift circuit provides a DC bias voltage to signals received by the pad to protect the protection circuit. With the invention, the protection circuit includes only single gate-oxide devices.

20 Claims, 7 Drawing Sheets

FIG.6

IMPLEMENTATION #1

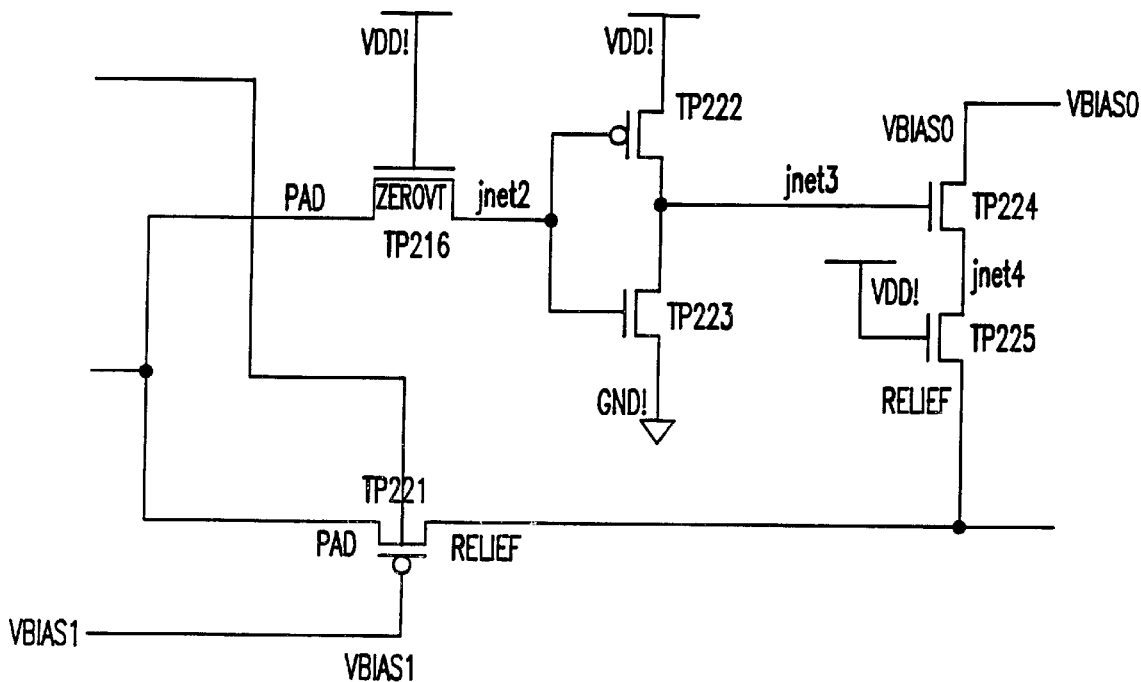

FLOATNW: Floating Nwell of "protect" circuitry

PAD: 2.5v (nominal) output voltage from Driver; also accepts 0v to 3.6v signals arriving from off-chip VBIAS1: DC bias voltage having range of 1.2v to 1.5v VBIAS0: DC bias voltage having range of 0.35v to 0.45v OUT: Passes CMOS or LVTTL or UP-SHIFT from Ground Voltage to devices responsible for "protecting" driver output when receiving signals from "off-chip"

VDD: Core supply voltage having range of 1.65v to 1.95v

ZEROVT: Zero Vt Nfet (TP216)

FIG.7

IMPLEMENTATION #2

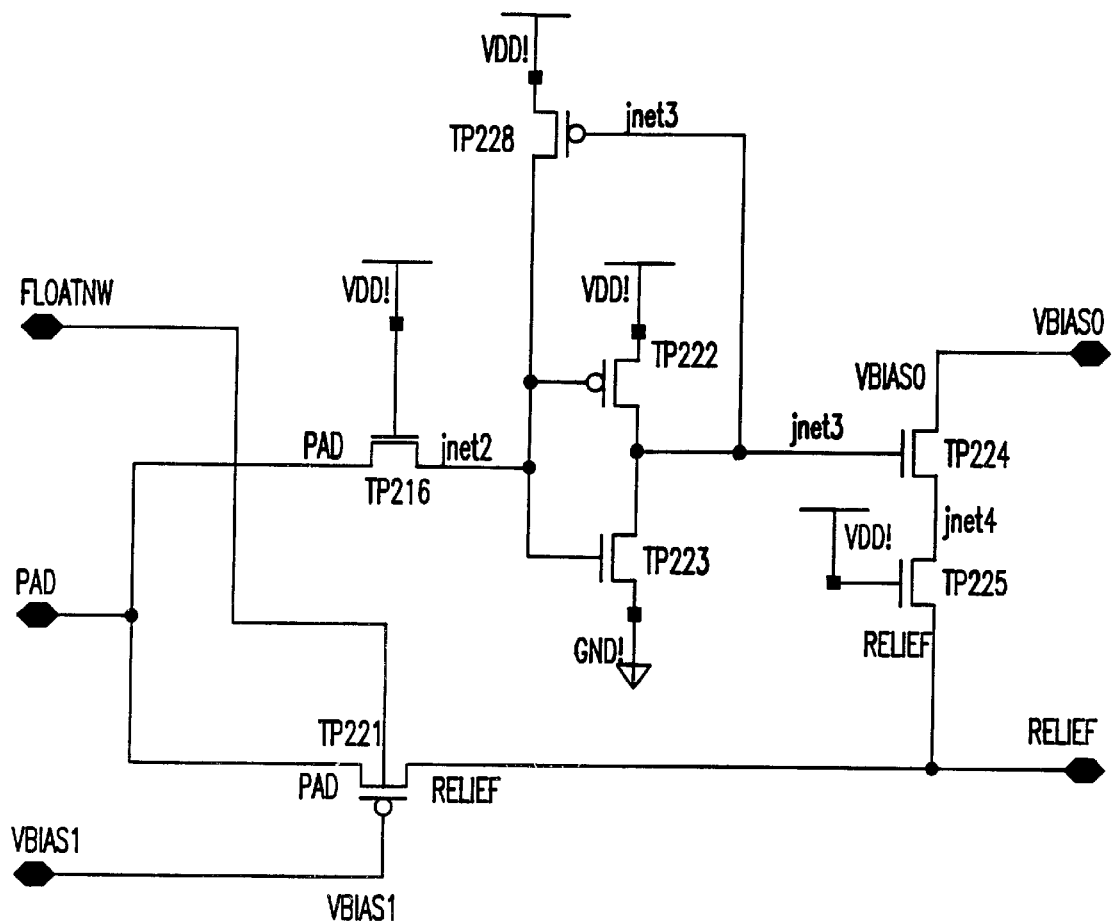

FLOATNW: Floating Nwell of "protect" circuitry

PAD: 2.5v (nominal) output voltage from Driver; also accepts 0v to 3.6v signals arriving from off-chip VBIAS1: DC bias voltage having range of 1.2v to 1.5v VBIAS0: DC bias voltage having range of 0.35v to 0.45v OUT: Passes CMOS or LVTTL or UP-SHIFT from Ground Voltage to devices responsible for "protecting" driver output when receiving signals from "off-chip"

VDD: Core supply voltage having range of 1.65v to 1.95v

INPUT/OUTPUT CIRCUIT HAVING UP-SHIFTING CIRCUITRY FOR ACCOMMODATING DIFFERENT VOLTAGE SIGNALS

BACKGROUND OF THE INVENTION

1. Field of the Invention

The present invention relates to input/output circuits for integrated circuits which include voltage protection circuitry and more particularly to an up-shift circuit for the protection circuitry.

2. Description of Related Art

In integrated circuit technology, devices in different integrated circuit ("IC") packages are interconnected to one another at input/output (I/O) pads. I/O pads are associated with electrical circuits which perform a desired function and interface with other IC packages or electrical devices. An I/O pad may be associated with electrical circuits which generate output signals and apply the signals to the I/O pad that external devices sense and process accordingly. Alternatively, an I/O pad may be associated with electrical circuits which sense the logic state of signals applied to the I/O pad by external electrical circuits or IC packages. I/O pads are frequently "bi-directional" in the sense that they may be used at different times for the sensing of input signals to the IC package or for the application of output signals from the IC package.

Electrical output signals are applied to an I/O pad by electrical circuits within the IC package associated with the I/O pad. Similarly, electrical signals are received as input signals from an I/O pad by associated electrical circuits within the IC package which "sense" the signal level and operate accordingly.

It is common for such interconnected circuits to utilize standard voltage levels to represent logic states of "0" and "1". Common standard voltage levels in the past have been 0 Volts (+/− a threshold value) to represent zero logic state and 5 Volts (+/− a threshold value) to represent the one logic state. As new IC manufacturing technologies evolve, the voltage levels used to represent a logic one state have been reduced to 3.3 Volts, 2.5 Volts, and further to 1.8 Volts. The lower voltage levels permit reduced thickness in transistor gate oxide materials to thereby reduce switching time of transistor gates and improve performance of the switching circuitry.

As gate oxide thickness is reduced in advanced low voltage CMOS technologies protecting the input/output circuit's dielectrics from over-voltage conditions becomes necessary when interfacing to higher voltage buses. What is needed is an input circuit fabricated in a 1.8 Volt CMOS technology which is compatible with 2.5 and 3.3 Volt low voltage transistor-transistor logic (LVTTL) bus wherein protection is provided to prevent verstressing gate oxide in the input circuit where undershoot/overshoot peaks of −1 Volt to LVTTL levels of 3.6 Volts+associated overshoot can occur on the input.

Further, it is important to discuss some of the device physics which play a role in hot electron (hot e−) field effect transistor (FET) degradation. For p+ diffusions in Nwell, separated by a poly gate, holes are accelerated across the channel, thereby inducing current in a P-type FET (PFET) device. Even though holes are the dominant population, it has been shown that electrons damage the integrity of the Si—O2 interface under a PFET gate. As holes are accelerated to high speeds, electrons coming in contact with holes get deflected and become trapped in the oxide. It is this trapping of electrons in the oxide that is responsible for changing the voltage threshold and current characteristics of a PFET device. The trapping problem is exacerbated at high voltage and at short channel lengths, as a higher field allows electrons to reach ever higher velocities and shorter channels increase the likelihood that an electron will collide with a hole and become embedded in the oxide defining the top of the PFET channel. Higher fields are typically encountered during In-Situ BURN-IN of a circuit, or field operation of the circuit at the highest voltage rating for the technology. The net affect is the PFETs, when exposed to high Vgs and high Vds become leaky over time and compromise the ability of the protection circuitry to shield the driver from voltage swings from 0 volts to LVTTL levels arriving at the PAD.

SUMMARY OF THE INVENTION

The invention comprises an input/output circuit of an integrated circuit chip that includes a pad, a protection circuit connected to the pad, and an up-shift circuit connected to the pad and the protection circuit. The up-shift circuit provides a DC bias voltage to signals received by the pad to protect the protection circuit. With the invention, the protection circuit includes devices having a single oxide depth thickness.

The up-shift circuit shifts a first voltage received by the pad to a second voltage higher than the first voltage. The first voltage is approximately 0V (Ground Potential) and the second voltage is approximately 0.4V.

The inventive structure includes a driver circuit connected to the pad, a protection circuit connected to pad, an up-shift circuit connected to pad and protection circuit and a driver circuit connected to the pad and the protect circuitry, wherein the protection circuit eliminates the prospect of current paths being established into the voltage rails via CMOS (e.g. 2.5V nominal) and LVTTL (e.g. 3.3V nominal) signals arriving from off-chip. The up-shift circuit raises voltages arriving from off-chip from Ground Potential to some greater value, serving to protect and improve reliability of the devices responsible for insuring no current paths are established into the voltage supply rails. In this way, gate to source transistor voltages of devices are reduced below a limit. Further, drain to source transistor voltages are reduced below a limit. CMOS (e.g. 2.7V max.) and LVTTL (e.g 3.6V max.) signals arriving from off-chip travel unabated thru the novel circuit to the devices responsible for insuring no current paths are established into the voltage supply rails.

ADVANTAGES OF THE INVENTION

The invention can be used to increase end-of-life operation of a dual-voltage I/O circuit, having VDD (1.8 v nominal) and VDD250 (2.5 v nominal) operating in a very thin single-oxide depth technology. The driver level-shifts it's data input from 1.8 v (nominal) to 2.5 v Jedec industry standard CMOS voltage levels in addition to receiving Jedec industry standard LVTTL levels (e.g., 3.3 V) and Jedec industry standard CMOS (2.5V) without (a) requiring a dual-oxide fabrication processing or without (b) enduring excessive oxide stress or diffusion stress during the life of the circuits. Therefore, with the invention, the reliability of the input/output circuit is greatly increased. Reliability improvement can be measured in several ways. First, consider FET behavior. Reduced diffusion (Vds) stress and less oxide stress (Vgs) translates into threshold voltage shift (Vt) and therefore less device current degradation through the life of the circuit. By reducing the stress seen by key transistors, the circuit does the following:

1) Increases the EOL (end-of-life) operation of the protect circuitry. Less stress translates into longer field operation.
2) Inclusion of "up-lift" circuit has no affect on the speed or block delays associated with the driver or receiver. Speed is not compromised whatsoever. The scope of said circuit is to provide stress relief to primary devices responsible for "protecting" the driver from high off-chip voltages arriving via the PAD node.
3) The invention offers the user a minimal increase in circuit overhead for a given IO design. A total of six new transistors (3 PFETs +3 NFETs) are required to reduce stressing of the "protect" devices described as prior art by Chan et al., U.S. Pat. No. 5,635,861 incorporated herein by reference. Hence, the invention offers minimal increase in circuit area for a given IO cell physical layout. In fact, it would require less area than an IO requiring thicker oxide to service. NFET and PFET transistors are connected at the PAD. In this case, the higher oxide voltage requires a longer NFET and PFET channel length. Since outputs FET's are quite large, implementing thick-oxide versions is a spatially demanding proposition.

BRIEF DESCRIPTION OF THE DRAWINGS

The foregoing and other objects, aspects and advantages will be better understood from the following detailed description of a preferred embodiment of the invention with reference to the drawings, in which:

FIG. 6 is a schematic architectural diagram illustrating a transistor level description of an embodiment of the invention.

FIG. 7 is a schematic architectural diagram illustrating a transistor level description of an embodiment of the invention.

DETAILED DESCRIPTION OF PREFERRED EMBODIMENTS OF THE INVENTION

Figure 1:
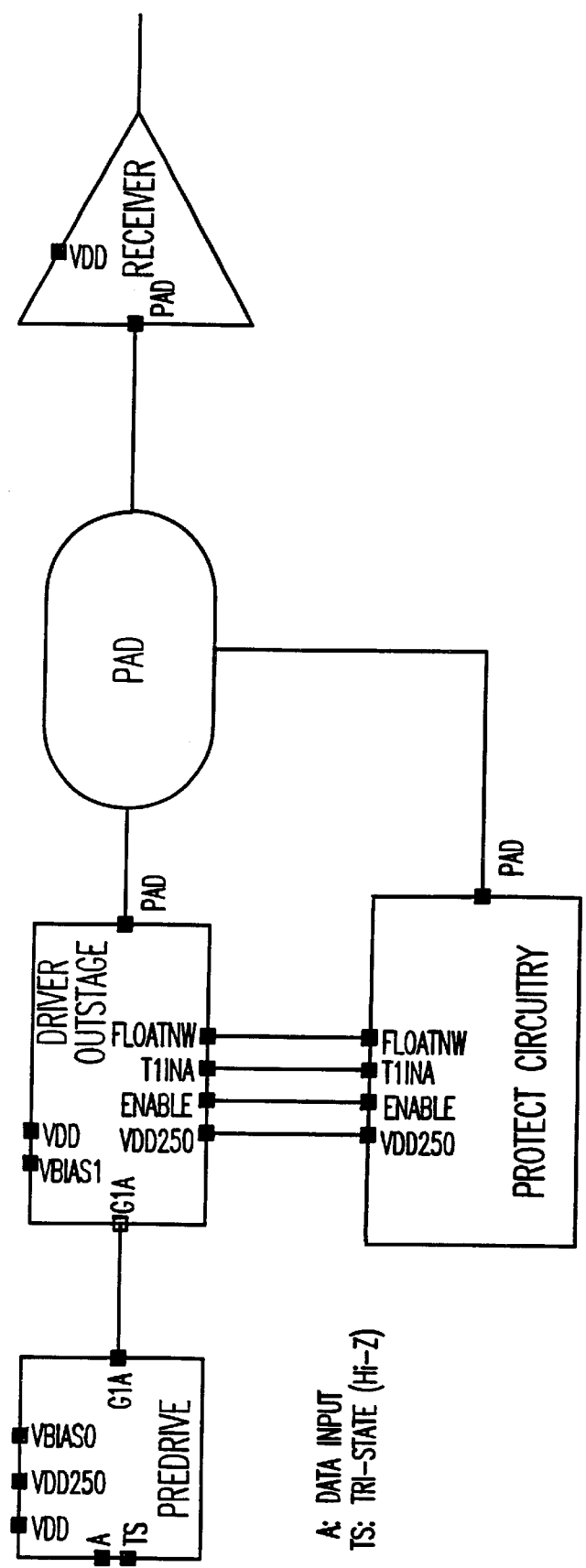
FIG. 1 is a schematic architectural diagram of protection circuitry positioned between a pad and a chip.

FIG. 1 illustrates a simplified schematic diagram of input/output circuitry. More specifically, a receiver 11 is connected to a pad 10. A protection circuit 12 is connected to the pad 10 and a predrive 13 and driver outstage 14 (e.g., a driver) to protect the driver 13 from excessive voltage conditions. This structure allows the chip to be manufactured with thin oxide devices that are designed to operate at lower voltage levels and still be able to connect through the pad 10 to much higher voltage supplies.

However, a problem exists with the structure shown in FIG. 1 when very low voltage signals are received by the pad 10. In many cases, if a low voltage (e.g., 1.8V) signal is received by the pad, the protection circuitry 12 will reduce this signal to 0V. Essentially, in this situation, and the protection circuitry 12 in performing its function of protecting the driver 13, 14 changes the "1" or "high" signal which exists at 1.8V to a "0" or "low" signal. Thus, the protection circuitry 12 can actually change the logical meaning of a signal received by the pad 10 when performing its protection operation. This situation essentially prevents the more advanced, very low voltage signals (e.g., 1.8V) from reaching the driver 13, 14.

In the figures, VDD represents the core supply voltage which operates between 1.65 V and 1.95V. Also, VDD250 represents the CMOS supply voltage which operates between the 2.3 V and 2.7 V. Further, VBIAS1 represents the DC bias voltage having a range of 1.2V to 1.5 V and VBIAS0 represents the DC bias voltage which has a range of 0.35V to 0.45V. The variable LT represents the leakage test pin. The variable FLOATNW represents a floating Nwell of the protect circuitry. Also, the variable ZEROVT represents a zero threshold voltage field effect transistor (TP 216). Additionally, the pad 10 can receive 2.5 V (nominal) output voltage from the driver 13, 14 and 0V to 3.6V signals arriving from off the chip. The output OUT passes the CMOS, LVTTL, or up-shift circuit from the ground voltage to devices responsible for "protecting" the driver output when receiving signals from off the chip.

Figure 2:
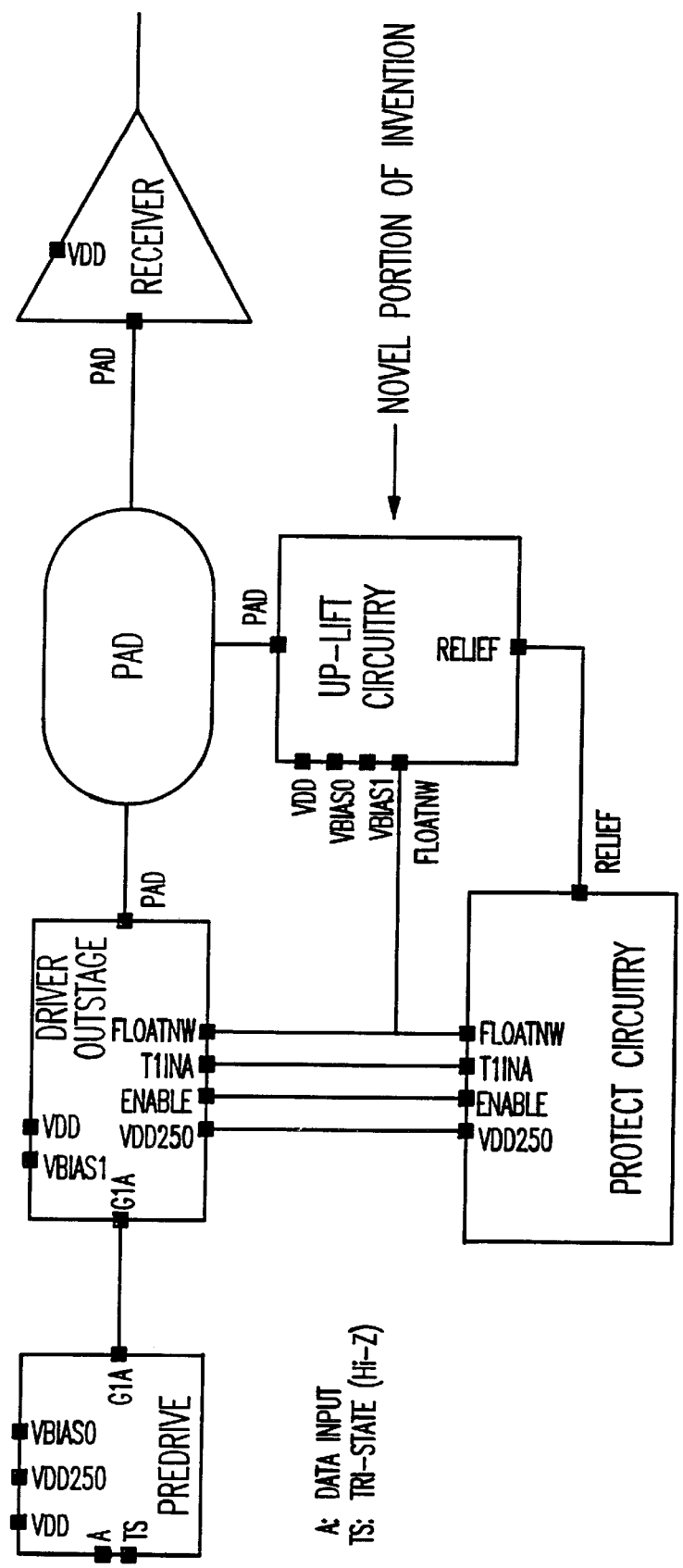
FIG. 2 is a schematic diagram illustrating up-shift circuitry included into the circuit shown in FIG. 1.

FIG. 2 also illustrates a structure which is similar to that shown in FIG. 1. However, in FIG. 2 the circuit also includes up-shift circuitry 20. The purpose of the up-shift circuitry 20 is to raise the voltage of very low voltage signals (e.g., 1.8V) so that the signals are not eliminated by the protection circuitry 12 and are processed by the driver 13, 14 as legitimate signals.

Figure 3:
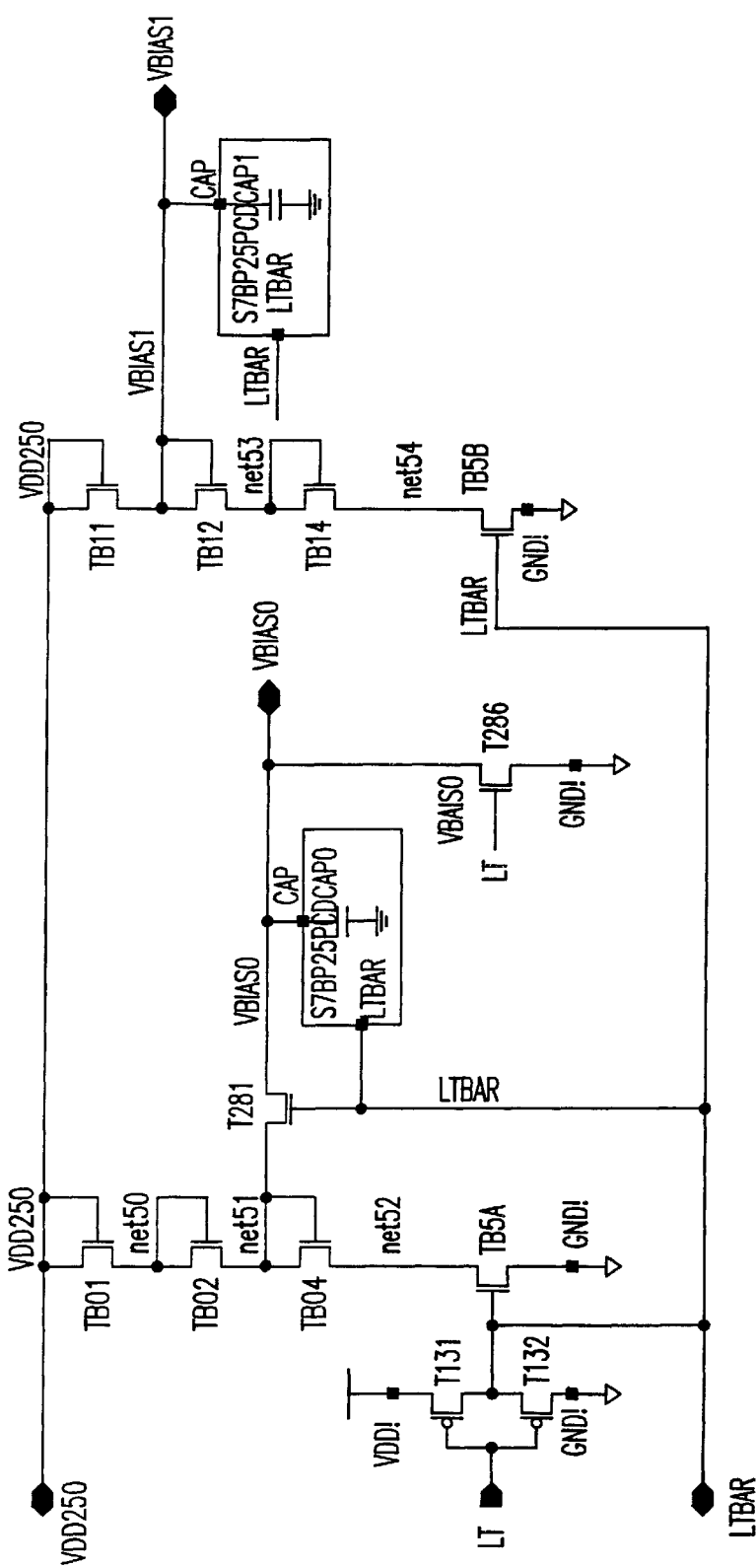
FIG. 3 is a schematic architectural diagram illustrating the generation of DC bias circuits as the protect circuit.

The up-shift circuitry 20 protects the protection circuitry 12 from low voltage signals input to the input pad 10. The up-shift circuitry 20 allows higher voltage signals to pass directly to the protection circuitry 12. The protection circuit 12 can accommodate such higher voltage signals; however, the lower voltage signals associated with advancing technology thin oxide devices can cause oxide stresses on the protection devices and can be damaging to the protection circuitry 12. In order to provide protection, the up-shift circuitry 20 provides a DC bias level above ground potential to protect the devices within the protection circuit 12. An important feature of the invention is that the up-shift circuitry 20 supplies a DC bias voltage (VBIASO) of between 0.35V and 0.45V, to allow for logic low or "0" signals to be propagated to the Chan et al circuit, and a DC bias voltage (VBIAS1) of between 1.2V and 1.5V , to allow logic "high" or "1" CMOS and LVTTL voltages to pass unabated to the Chan et al circuit. FIG. 3 illustrates a DC bias circuit for use by the driver 13, 14 and the up-lift circuitry 20.

FIG. 3 is used to establish two DC bias voltages used in the novel "up-lift" circuit and other pieces of the driver. A series of "IR" (i.e., voltage) drops, via NFETs TB01, TB02 and TB04 provide a DC bias at node "net51", which has a range of approximately 0.35 v to 0.45 v. In functional mode, LT=0, such that node "LTBAR" is a logic high, thereby ensuring that NFET T281 is fully on. This NFET serves to pass the bias voltage at "net51" to node VBIAS0. Hence, during circuit operation, VBIAS0 is approximately 0.35 v to 0.45 v. VBIAS0 is used in the novel "up-lift" circuit and the PreDriver 13.

In a similar way, NFETs TB11, TB12 and TB14 set up a series of "IR" (i.e., voltage) drops, thereby producing a DC bias voltage VBIAS1 having a range of 1.2 v to 1.5 v. This voltage is supplied to the novel "up-lift" circuitry and to the Outstage portion 14 of the driver circuit.

Figure 4:
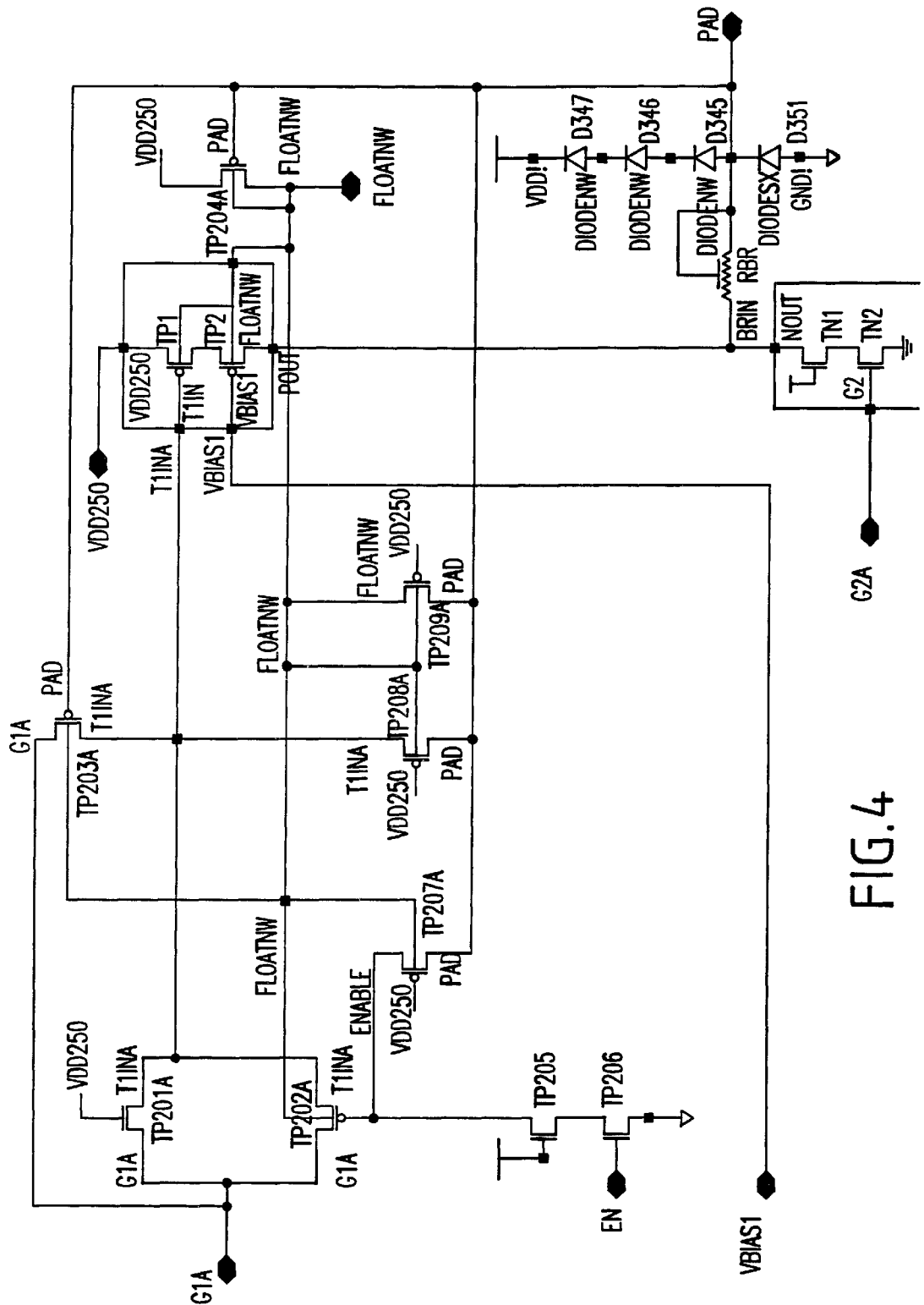
FIG. 4 is a schematic architectural diagram illustrating a "protect" circuit based on U.S. Pat. No. 5,635,861 issued to Chan et al.

FIG. 4 illustrates the internal structure of the protect circuitry 12. More specifically, FIG. 4 shows a driver outstage, ESD device, and associated protect circuitry. The outstage has a pullup section, comprising stacked PFETs TPI and TP2, to allow the PAD to reach a logic "high" of 2.5 v nominal. The gate of TP1 is fed via an internal node "T1INA" and TP2 is attached to DC bias voltage VBIAS1, having a operating range of 1.2 v to 1.5 v. The pulldown section of the outstage is composed of stacked NFETs TN1 and TN2, with the gate of TN1 tied to the VDD supply voltage (1.65 v to 1.95 v) and the gate of TN2 connected to PreDrive node "G2A". The ESD device is a generic implementation, having one substrate diode connected to PAD and series string of diodes from PAD to the supply voltage VDD. An important feature shown in FIG. 4 is the implementation of transmission gates TP201A and TP202A, along with "protect" devices TP203A, TP204A, TP207A, TP208A, and TP209A, originally submitted for patenting by Chan et al., supra.

For example, in a functional mode, driving a logic high to the PAD, EN, via internal logic is a logic high of VDD, or 1.8 v nominal. The G1A node, due to internal level shifting and VBIAS0, become approximately 0.4 v, nominal. Since NFET TP201A is biased to VDD250, the 0.4 v signal at G1A is propagated thru to node T1INA, thereby turning PFET TP1 on. Since the gate of PFET TP2 is more than a threshold voltage below VDD250, both PFETs are "ON" and the PAD node is pulled up to VDD250, or 2.5 v nominal. At the same time, the gate of pulldown NFET TN2 is 0 v, such that the pulldown stage is fully off. Now considering functional mode again, this time driving a logic low to the PAD, again, EN equals Vdd volts, due to internal gating (TS=1), such that the "ENABLE" node is pulled to Gnd. G1A is pulled high to VDD250, since the goal is to shut off the pullup stage. Via PFET transmission gate TP202A, the VDD250 logic high signal at node G1A is propagated to node T1INA, the gate of output PFET TP1. In this way, the pullup stage is completely shut off. However, due to gating in the Predrive 13, the gate of NFET TN2 (Node G2A) is at a logic high of VDD volts, such that the PAD node is pulled down to a logic zero. In Hi-Z mode, node G1A is at VDD250 volts. When Hi-Z is invoked, EN swings from Vdd volts to Gnd. However, long channel lengths associated with TP205 and TP206 allow the "ENABLE" node to pull up very slowly from Gnd (TSs=1) to Vdd250 (TS=0). Hence, node G1A, at VDD250 volts, is allowed to propagate thru passgate TP202A to output PFET TP1. Also, due to Hi-Z, the gate of pulldown NFET TN2 is at 0 volts. In this way, no current exists at the "BRIN" node. The driver has been Tri-Stated. Now, a 2.5 v signal arrives from off chip. This voltage is not felt at nodes FLOATNW, ENABLE and T1INA, providing VDD250 is above the incoming PAD voltage. However, if VDD250 is less than the incoming PAD voltage (ex. vdd250=2.3, PAD=2.7 v), this is enough to trip PFETs TP209A, TP207A and TP208A, such that the FLOATNW, ENABLE and T1INA nodes become the PAD voltage (in this case, 2.7 v). The same behavior holds true for LVTTL levels arriving at PAD.

Now considering the case of the Driver in Hi-Z, and 0 volts arriving at PAD, two new PFETs engage, to insure nodes FLOATNW and T1INA are sufficiently pulled up to VDD250 volts, thereby keeping the pullup stage fully off; they are TP204A and TP203A. TP204A is responsible for pulling the FLOATNW node to VDD250 volts. Also, TP203A is in charge of pulling the T1INA node to VDD250 volts. Note that this condition (0 volts at PAD, driver in HI-Z) has potentially 2.7 volts of Vgs and Vds across PFET devices TP203A, TP204A, TP207A, TP208A and TP209A. These stresses will significantly compromise reliability in a thin oxide process, where the electric fields must be minimized to assure transistor integrity over the long term. In older device technologies this circuit performed well for "protected" IO interfaces, as the limits on Vgs and Vds for devices direct connected to PAD were significantly higher than current technologies with very thin oxide thicknesses. Further, the dichotomy of ever shrinking oxide thicknesses, along with the continued need to communicate with LVTTL levels associated with legacy hardware (for example, DRAM), has put the current implementation at risk, in terms of device reliability and circuit life expectancy (realizable Power-On-Hours of field operation). A new circuit is needed to bolt onto this existing "protection" circuitry to save it from oxide and diffusion stress.

Figure 5:
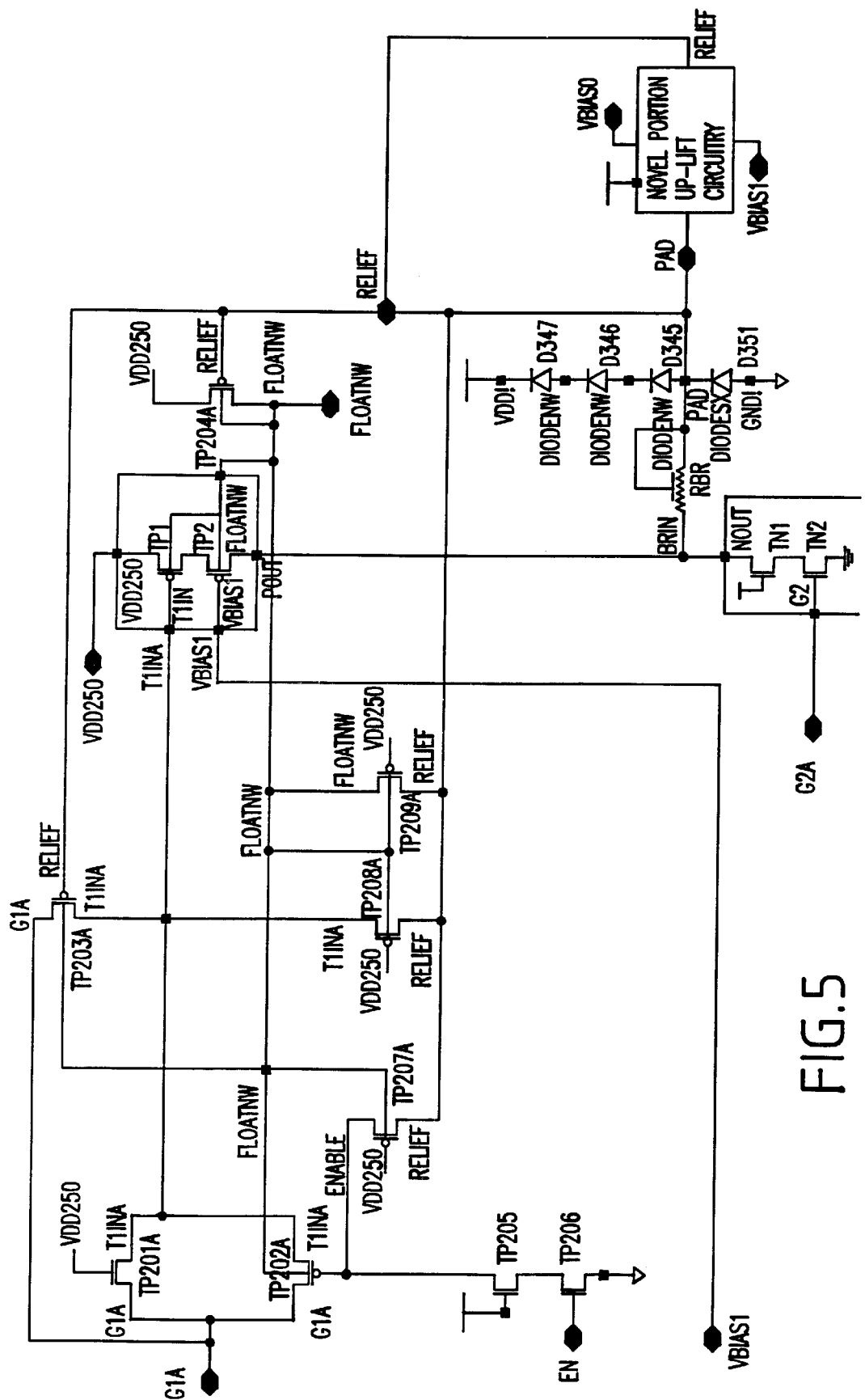
FIG. 5 is a schematic architectural diagram illustrating a transistor level description of an embodiment of the invention.

FIG. 5 operates in exactly the same way as FIG. 4 (as previously described) with the exception that a "up-lift" circuit protects PFET devices TP203A, TP204A, TP207A, TP208A, and TP209A from Vgs and Vds overstressing. When 0 volts exists at the PAD when the driver is in Tri-State (Hi-Z mode), the RELIEF node coming from the "up-lift" circuit provides an upshift from 0V @ PAD to a bias of 0.35 v to 0.45 v, which is then transferred to the sources of PFET devices TP203A, TP204A, TP207A, TP208A and TP209A, to protect said devices from Vgs and Vds overstressing. Detail of this is provided via FIGS. 6 and 7.

FIG. 6 illustrates the internal structure of the up-lift circuitry 30. To prevent overstress of very thin oxide devices, the following technology guidelines are set forth, thereby serving as the catalyst fo rthe novel invention represented here.

a) Vgs (gate-to-source dielectric oxide stress) maximum= 2.4 v b) Vds (drain-to-source diffusion stress) maximum=1.95 v This value can be increased as FET channel length is increased, such that a maximum of 2.3V to 2.4V of Vds can exist.

Voltage supplies and derived DC bias voltages for (but not limited to) this application are as follows:

a) Native core supply voltage (VDD), having a range from 1.65V to 1.95V b) CMOS supply voltage (VDD250), having a range of 2.3V to 2.7V c) DC bias voltage (VBIAS0), having range of 0.35V to 0.45V d) DC bias voltage (VBIAS1), having range of 1.2V to 1.5V In FIG. 1, the circuit is intended to provide Vgs (dielectric) and Vds (diffusion) stress relief to those devices historically used to "protect" the driver outstage from LVTTL levels arriving from off-chip (see Chan et al., supra).

For example, say the driver is in Hi-Z mode and 0 volts is arriving from off-chip. The conventional structure in Chan concerns transistors TP201A, TP202A, TP203A, TP204A, TP207A, TP208A and TP209A. Further, assume that VDD250 is operating at it's maximum value of 2.7 volts. This means that 2.7 volts of Vgs (gate-to-source) exists for PFET's TP207A, TP208A and TP209A, as their gates are tied to VDD250 and their source diffusions are tied to 0V from PAD. Also, 2.7 volts of Vgs exists for TP203A and TP204A, as their diffusions are tied to 2.7 v (node G1A and VDD250, respectively) and gates tied to PAD voltage of 0V. With this in mind, one can see the circuit is violating (a) in the above mentioned list of reliability restrictions, as Vgs>2.4 v maximum. In addition, Vds (drain-to-source) stress for TP208A and TP209A is 2.7 v, as node T1INA=2.7 v and FLOATNW=2.7 v and while the drain side of each device is a 0 v via PAD. This violates (b) in the above mentioned reliability restrictions.

The inventive structure shown in FIG. 6 overcomes these Vgs and Vds issues when driver is in Hi-Z and 0V has arrived at PAD from off-chip. With the invention, 0 volts at the PAD node is bumped up to 0.4 v at the RELIEF node. This can be thought of as level shifting of the down level of an incoming I/O signal from substrate potential to some DC bias value above the substrate potential. By tracing thru the circuit level devices, referring to FIG. 6, assume 0V is at PAD. The 0V signal is not allowed to pass thru PFET TP221, the gate of which is tied to a DC bias circuit called VBIAS1 (having a range of 1.2V to 1.5V). However, the 0V signal is propagated thru the Zero Vt NFET TP216. Hence 0V arrive at the gates of PtL't TP222 and NFET TP223. PFET TP222 is fully on, such that VDD volts is transmitted to the gate of NFET TP224. Therefore, with a logic "1" (VDD) at gate of TP224 and VDD at gate of TP225, the DC bias voltage VBIAS0 (see FIG. 5) is transferred to the RELIEF node. This VBIAS0 bias voltage is then propagated to the conventional (Chan et al.) devices TP203A, TP204A, TP207A, TP208A and TP209A.

As previously mentioned, with the driver in Hi-Z, the pullup outstage (e.g. stacked PFETs) is inactive. With VDD250 at nodes G1A, T1INA & FLOATNW, these nodes could be as high as 2.7 v. The stress relief circuit, outputting 0.4V (nominal) at the RELIEF node, insures that Vgs of PFET's TP203A, TP204A, TP207A, TP208A and TP209A is always less than the 2.4 v maximum allowed by the reliability community for the given technology.

Moving to Vds (drain-to-source) voltage, the 7s0 D.M say the maximum allowable is 1.95 v; however said manual goes on to say that Vds can be increased beyond 1.95V by increasing channel length. The reliability device community has data correlating channel to Vds from 1.95 v to 2.4 v. Anything beyond 2.4 v Vds is not supported. In Hi-Z, with 0V at PAD and VDD250 at it's highest operating voltage (i.e. 2.7V), examining the prior art by Chan et al. (See FIG. 7), PFETs TP207A, TP208A and TP209A would have Vds of 2.7 volts. In other words, said circuit would operate at 2.7 v, or 0.3 v above the maximum value of Vds (drain-to-source voltage of 2.4 v) allows by the reliability community for the given technology. The inventive "up-lift" circuit (See FIG. 8) insures that Vds of PFET devices TP207A, TP208A and TO209A does not exceed 2.4 v.

The "up-lift" circuit significantly reduces gate-to-source (dielectric) stress and drain-to-source (Hot e−) stress of the device thru End-Of-Life operation, by reducing the Vt shifts and resulting current degrade.

Tracing through the circuit behavior with a CMOS (2.5V nominal) voltage at the PAD, a 2.5V signal from PAD is propagated thru PFET TP221, since it's gate is tied to DC bias voltage, VBIAS1, operates in a range of 1.2 to 1.5 volts. Hence, the CMOS (2.5 v) voltage is transmitted to the RELIEF node unabated. Further, with 2.5 v at PAD, and at the source of Zero Vt NFET TP216, the gate of TP216 insures that VDD is transferred to node JNET2, serving the gates of PFET TP222 and NFET TP223. NFET TP223 is fully on in this mode. Therefore, the gate of TP224 is fully off, such that no current path is established from NFET's TP224 and TP225 to the RELIEF node.

Further, the behavior observed for LVTTL (3.3 v nominal) voltages at PAD is analogous to that of CMOS (2.5 v nominal) voltage at PAD. The 3.3 v PAD signal is passed from the PAD node to the RELIEF node via PFET TP221 (again, it's gate is tied to DC bias voltage VBIAS1). With 3.3 v at PAD, Zero Vt NFET TP216 passes a voltage of VDD to the jnet2 node serving the gates of PFET TP222 and NFET TP223. TP223 is fully on in this mode. Therefore, the gate of TP224 is fully off, such no current path is established from NFET's TP224 and TP225 to the RELIEF node.

Another embodiment of the stress relief circuit can be found in FIG. 7. With this alternative, there is no need for a Zero Vt NFET device. In other words, the Zero Vt NFET is replaced with a regular NFET device. The reader will notice an extra device (PFET), with its gate connected to node jnet3, the output of the inverter made using PFET TP222 and NFET TP223. One can think of this as a feedback, or keeper, PFET. With volts at PAD, 0 volts is passed thru NFET TP216 thereby making node jnet2 0 volts. TP222 is fully on in this mode. Hence, note jnet3 is at VDD volts (1.8 v nominal) and serves to fully shut off PFET TP228 and fully turn on NFET TP224. With the gates of both NFET's TP224 and TP225, the CD bias voltage VBIAS0 is transferred to the RELIEF node.

With a CMOS (2.5V nominal) or LVTTL (3.3V nominal) signal arriving at PAD, either of these voltage are transferred to PAD. Further, the output of NFET TP216 (also the gates of NFET's TP222 and TP223) is a VDD (1.8 v nominal) voltage minus a Vt shift. This is a weak logic high, if you will. This weak logic high is strong enough to turn on NFET TP223, propagating 0 volts to the feedback PFET TP228. The PFET TP228 is now fully on and the gates of TP222 and TP223 are pulled up from a weak logic high (VDD−Vt) to a strong logic high (VDD) states. This serves to prevent any leakage current from PFET TP222, since the PFET is now fully off. The 0 volts at the gate of TP224 causes no current path to be established from the DC bias voltage VBIAS0 to the RELIEF node. Conversely, PFET TP221 transfers the CMOS or LVTTL voltage from the PAD node to the RELIEF node.

Basically, to design circuits in incrementally thinner oxide thicknesses, new ways of protecting drivers and receivers must be developed. FIG. 6 describes one way of providing driver protection circuit at the I/P PAD, when thicker oxides and higher device breakdown voltages were the norm. FIG. 3, along with FIGS. 5, 6 and 7 show that circuit tricks and dc voltage biasing are required to maintain device integrity. Such protection schemes will lessen burnout of transistors and prevent shortening the number of hours of achievable circuit operation. Although the invention described does involve slightly more circuit overhead, wafer fabrication costs are significantly less, as a separate, thicker Oxide to support LVTTL voltages from legacy hardware is not required.

Some benefits of the invention include: lower fabrication costs, as a thicker oxide to handle LVTTL voltages from legacy hardware is not required; increased Power-On-Hours, or circuit life expectancy; and no change to driver or receiver functional mode block delay.

Also with the invention, the area required to layout thick-oxide devices connected to PAD exceeds the area required by the novel "up-lift" circuit having only six extra devices (3 NFETs and 3 PFETs), and the same circuit construct can be migrated to technologies having lower device voltage and oxide thicknesses.

The invention has the ability to drastically reduce reliability degradation throughout the life of transistors that "protect" the driver from LVTTL voltages arriving from off-chip.

The invention was borne out of necessity, as the particular device technology only offers a single gate-oxide layer. "Oxide" being the layer sandwiched between the PolySilicon defining the gate of the transistor and Nwell (for PFET's) or P-substrate (for implemented, does not support the use of two separate oxide thicknesses. Hence, there is no possibility of employing a thicker oxide under those devices seeing LVTTL voltages arriving from off-chip. This is commonly known in the industry as "dual-oxide" capability, or using two oxides; the thinner to support devices in the native voltage regime supported by the technology, and the thicker to support devices seeing voltages above the technology definition. The invention eliminates the need for "dual-ox" processing.

While the invention has been described in terms of preferred embodiments, those skilled in the art will recognize that the invention can be practiced with modification within the spirit and scope of the appended claims.

What is claimed is:

1. An input/output circuit of an integrated circuit chip comprising:

a pad;

a protection circuit connected to said pad; and an up-shift circuit connected to said pad and said protection circuit, wherein said up-shift circuit provides a DC bias voltage to signals received by said pad to protect said protection circuit.

2. The input/output circuit in claim 1, wherein said up-shift circuit shifts a first voltage received by said pad to a second voltage higher than said first voltage.

3. The input/output circuit in claim 2, wherein said first voltage comprises approximately 1.8 V and said second voltage comprises approximately 2.5 V.

4. The input/output circuit in claim 1, wherein said protection circuit includes only single gate-oxide devices.

5. The input/output circuit in claim 1, further comprising a driver circuit connected to said pad and said protect circuitry, wherein said protection circuit reduces voltages to a level below a limit and said up-shift circuit raises voltage levels of selected ones of said signals.

6. The input/output circuit in claim 5, wherein said selected ones of said signals comprise signals having a voltage of approximately 1.8 V.

7. The input/output circuit in claim 5, wherein said limit comprises approximately 2.7 V.

8. An input/output circuit of an integrated circuit chip comprising:

a pad;

a protection circuit connected to said pad;

an up-shift circuit connected to said pad and said protection circuit; and a driver circuit connected to said pad and said protect circuitry, wherein said protection circuit reduces voltages of signals received by said pad to a level below a limit and said up-shift circuit raises voltage levels of selected ones of said signals to said limit.

9. The input/output circuit in claim 8, wherein said selected ones of said signals comprise signals having a voltage of approximately 1.8 V.

10. The input/output circuit in claim 9, wherein said limit comprises approximately 2.7 V.

11. The input/output circuit in claim 8, wherein said up-shift circuit provides a DC bias voltage to said signals received by said pad to protect said protection circuit.

12. The input/output circuit in claim 11, wherein said up-shift circuit shifts a first voltage received by said pad to a second voltage higher than said first voltage.

13. The input/output circuit in claim 12, wherein said first voltage comprises approximately 1.8 V and said second voltage comprises approximately 2.5 V.

14. The input/output circuit in claim 8, wherein said protection circuit includes only single gate-oxide devices.

15. An integrated circuit chip comprising:

a pad;

a protection circuit connected to said pad;

an up-shift circuit connected to said pad and said protection circuit;

a driver circuit connected to said pad and said protect circuitry; and logic devices driven by said driver, wherein said protection circuit reduces voltages of signals received by said pad to a level below a limit and said up-shift circuit raises voltage levels of selected ones of said signals to said limit.

16. The integrated circuit chip in claim 15, wherein said selected ones of said signals comprise signals having a voltage of approximately 1.8 V.

17. The integrated circuit chip in claim 16, wherein said limit comprises approximately 2.7 V.

18. The integrated circuit chip in claim 15, wherein said up-shift circuit provides a DC bias voltage to said signals received by said pad to protect said protection circuit.

19. The integrated circuit chip in claim 18, wherein said up-shift circuit shifts a first voltage received by said pad to a second voltage higher than said first voltage.

20. The integrated circuit chip in claim 19, wherein said first voltage comprises approximately 1.8 V and said second voltage comprises approximately 2.5 V.

* * * * *